US008077516B2

(12) United States Patent
Hung et al.

(10) Patent No.: US 8,077,516 B2
(45) Date of Patent: Dec. 13, 2011

(54) METHOD AND APPARATUS FOR ACCESSING MEMORY WITH READ ERROR BY CHANGING COMPARISON

(75) Inventors: Chun-Hsiung Hung, Hsinchu (TW); Han-Sung Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/830,114

(22) Filed: Jul. 2, 2010

(65) Prior Publication Data

US 2011/0060962 A1      Mar. 10, 2011

Related U.S. Application Data

(63) Continuation-in-part of application No. 12/275,606, filed on Nov. 21, 2008, now Pat. No. 7,773,421, which is a continuation-in-part of application No. 11/735,911, filed on Apr. 16, 2007, now Pat. No. 7,471,562.

(60) Provisional application No. 60/746,733, filed on May 8, 2006.

(51) Int. Cl.
*G11C 16/06* (2006.01)
(52) U.S. Cl. .......... 365/185.09; 365/189.07; 365/189.09
(58) Field of Classification Search ............. 365/185.09, 365/189.07, 189.09
See application file for complete search history.

(56) References Cited

U.S. PATENT DOCUMENTS

| 4,317,169 | A | 2/1982 | Panepinto, Jr. et al. |
| 4,387,423 | A | 6/1983 | King et al. |
| 5,432,802 | A | 7/1995 | Tsuboi et al. |
| 5,467,357 | A | 11/1995 | Asami et al. |
| 5,603,001 | A | 2/1997 | Sukegawa et al. |
| 5,732,092 | A | 3/1998 | Shinohara et al. |
| 5,754,506 | A | 5/1998 | Katayama et al. |
| 5,765,185 | A | 6/1998 | Lambrache et al. |
| 5,956,743 | A | 9/1999 | Bruce et al. |
| 6,041,001 | A | 3/2000 | Estakhri |
| 6,272,659 | B1 | 8/2001 | Zook |
| 6,349,056 | B1 | 2/2002 | Conley et al. |
| 6,639,849 | B2 | 10/2003 | Takahashi et al. |
| 6,651,212 | B1 | 11/2003 | Katayama et al. |
| 6,683,817 | B2 | 1/2004 | Wei et al. |
| 6,799,256 | B2 | 9/2004 | Van Buskirk et al. |
| 6,839,875 | B2 | 1/2005 | Roohparvar |
| 6,992,932 | B2 | 1/2006 | Cohen |
| 7,212,423 | B2 | 5/2007 | Vogt |
| 7,225,390 | B2 | 5/2007 | Ito et al. |
| 7,392,457 | B2 | 6/2008 | Tamura et al. |
| 7,471,562 | B2 | 12/2008 | Hung et al. |

(Continued)

FOREIGN PATENT DOCUMENTS

JP        9320289 A      12/1997

*Primary Examiner* — Tuan T. Nguyen

(74) *Attorney, Agent, or Firm* — Kenta Suzue Haynes Beffel & Wolfeld LLP

(57) ABSTRACT

In response to a disagreement between a previously generated check code associated with previously programmed data bits and a more recently generated check code generated in response to a read command, the comparison process is changed, between i) a value representing accessed data and ii) a reference applied to such accesses to distinguish between logical levels. For example, the ratio of resistances characterizing input circuits of a sense amplifier and/or the read bias arrangement and/or a read reference of a memory integrated circuit is/are changed.

23 Claims, 18 Drawing Sheets

U.S. PATENT DOCUMENTS

| | | |
|---|---|---|
| 7,603,592 B2 | 10/2009 | Sekiguchi et al. |
| 7,773,421 B2 | 8/2010 | Hung et al. |
| 7,872,912 B2 * | 1/2011 | Sarin et al. ............... 365/185.03 |
| 2004/0153902 A1 | 8/2004 | Machado et al. |
| 2005/0122790 A1 | 6/2005 | Ueno et al. |
| 2005/0172065 A1 | 8/2005 | Keays |
| 2006/0026489 A1 | 2/2006 | Noda et al. |
| 2006/0036897 A1 | 2/2006 | Lin et al. |
| 2006/0104115 A1 | 5/2006 | Chun et al. |
| 2006/0221696 A1 | 10/2006 | Li |
| 2009/0310408 A1 * | 12/2009 | Lee et al. ................. 365/185.09 |
| 2011/0063906 A1 * | 3/2011 | Sarin et al. ............... 365/185.03 |

* cited by examiner

METHOD AND APPARATUS FOR ACCESSING MEMORY WITH READ ERROR BY CHANGING COMPARISON

REFERENCE TO RELATED APPLICATION

This application is a continuation-in-part of U.S. patent application Ser. No. 12/275,606, filed 21 Nov. 2008, which is a continuation-in-part of U.S. patent application Ser. No. 11/735,911, filed 16 Apr. 2007, which claims the benefit of U.S. Provisional Patent Application No. 60/746,733, filed 8 May 2006. All applications are incorporated by reference.

BACKGROUND OF THE INVENTION

1. Field of the Invention

The invention relates to nonvolatile memory integrated circuits generally, and more particularly to error detection and error correction of data that are read from nonvolatile memory.

2. Description of Related Art

The purpose of nonvolatile memory is to store data reliably, such that power loss does not affect the integrity of the stored data. To allow for unforeseen charge gain or charge loss that might affect a threshold voltage of a nonvolatile memory cell, a margin separates threshold voltage ranges that represent different logical levels. However, despite this margin, errors nevertheless occur, such that a data bit programmed as a high logical level will be read as a low logical level, or vice versa.

Although error correction and error detection algorithms will address some of these errors, error correction and error detection algorithms are only designed to handle a limited number of incorrect bits. After this limit is exceeded, error correction and error detection algorithms are insufficient. Moreover, error detection will detect, but not correct, such errors.

Therefore, a need exists for an improvement that makes nonvolatile memory integrated circuits more robust in the face of errors.

SUMMARY OF THE INVENTION

One aspect of the technology is a method of reading memory. In response to a read command, the memory performs the following:
generating a first check code based on accessing a plurality of data bits stored on the memory;
accessing a second check code stored on the memory as a plurality of check bits associated with the plurality of data bits;
checking whether the first check code and the second check code are in agreement; and
responsive to disagreement between the first check code and the second check code, changing a comparison between i) at least one value representing at least one of the plurality of data bits stored on the memory, said at least one value accessed by a read bias arrangement applied on the memory, and ii) at least one reference applied to accesses of the data bits stored on the memory, said at least one reference and the comparison distinguishing between logical levels represented by said at least one value, including:
changing the comparison by changing a ratio of a first resistance and a second resistance, the first resistance characterizing a first input circuit of a sense amplifier that receives said at least one value, the second resistance characterizing a second input circuit of the sense amplifier that receives said at least one reference.

In some embodiments, the value of the comparison is a current representing at least one of the data bits, and/or a voltage representing said at least one of the data bits.

In some embodiments, the first check code and the second check code are error correcting codes or error detecting codes.

In some embodiments, changing the comparison includes changing the read bias arrangement applied on the memory; changing a word line voltage of the read bias arrangement applied on the memory; and/or changing i) said at least one reference and ii) the read bias arrangement applied on the memory.

In some embodiments, after changing the comparison, based on this change of the comparison, the memory repeats one or more of:
said generating the first check code;
said accessing the second check code; and
said checking whether the first check code and the second check code are in agreement.

In some embodiments, after changing the comparison, based on this change of the comparison, the memory performs:
until success results from subsequent checking whether the first check code and the second check code are in agreement, iteratively changing the comparison.

In some embodiments, the reference of the comparison distinguishes between at least a first logical level and a second logical level of said logical levels. The value of the comparison is accessed to distinguish whether at least one of the data bits represents the first logical level or the second logical level. Changing the comparison comprises:
widening a first range of the accessed values associated with the first logical level; and
narrowing a second range of the accessed values associated with the second logical level.

Another aspect of the technology is a memory. The memory has a memory array and control circuitry coupled to the memory array. The control circuitry is responsive to the memory receiving a read command by performing:
generating a first check code based on accessing a plurality of data bits stored on the memory array;
accessing a second check code stored on the memory as a plurality of check bits associated with the plurality of data bits;
checking whether the first check code and the second check code are in agreement;
responsive to disagreement between the first check code and the second check code, changing a comparison between i) at least one value representing at least one of the plurality of data bits stored on the memory array, said at least one value accessed by a read bias arrangement applied to the memory array, and ii) at least one reference applied to accesses of the data bits stored on the memory array, said at least one reference and the comparison distinguishing between logical levels represented by said at least one value, including:
changing the comparison by changing a ratio of a first resistance and a second resistance, the first resistance characterizing a first input circuit of a sense amplifier that receives said at least one value, the second resistance characterizing a second input circuit of the sense amplifier that receives said at least one reference.

In some embodiments, at least one value of the comparison is a current representing at least one of the data bits, and/or a voltage representing said at least one of the data bits.

In some embodiments, the first check code and the second check code are error correcting codes or error detecting codes.

In some embodiments, the control circuitry changes the comparison by changing the read bias arrangement applied to the memory array; by changing a word line voltage of the read bias arrangement applied to the memory array; and/or by changing i) at least one reference and ii) the read bias arrangement applied to the memory array.

In some embodiments, after changing the comparison, based on this change of the comparison, the control circuitry repeats one or more of:
said generating the first check code;
said accessing the second check code; and
said checking whether the first check code and the second check code are in agreement.

In some embodiments, after changing the comparison, the control circuitry further performs:
until success results from subsequent checking whether the first check code and the second check code are in agreement, iteratively changing the comparison.

In some embodiments, at least one reference of the comparison distinguishes between at least a first logical level and a second logical level of said logical levels. At least one value of the comparison is accessed to distinguish whether at least one of the data bits represents the first logical level or the second logical level. The control circuitry performs said changing the comparison by:
widening a first range of the accessed values associated with the first logical level; and
narrowing a second range of the accessed values associated with the second logical level.

Another aspect of the technology is a memory. The memory has a memory array means and control circuitry means coupled to the memory array means. The control circuitry means is responsive to the memory receiving a read command. The control circuitry means includes:
means for generating a first check code based on accessing a plurality of data bits stored on the memory;
means for accessing a second check code stored on the memory as a plurality of check bits associated with the plurality of data bits;
means for checking whether the first check code and the second check code are in agreement; and
means, responsive to disagreement between the first check code and the second check code, for changing a comparison between i) at least one value representing at least one of the plurality of data bits stored on the memory, said at least one value accessed by a read bias arrangement applied on the memory, and ii) at least one reference applied to accesses of the data bits stored on the memory, said at least one reference and the comparison distinguishing between logical levels represented by said at least one value, including:
means for changing a ratio of a first resistance and a second resistance, the first resistance characterizing a first input circuit of a sense amplifier that receives said at least one value, the second resistance characterizing a second input circuit of the sense amplifier that receives said at least one reference.

DETAILED DESCRIPTION

Figure 1:
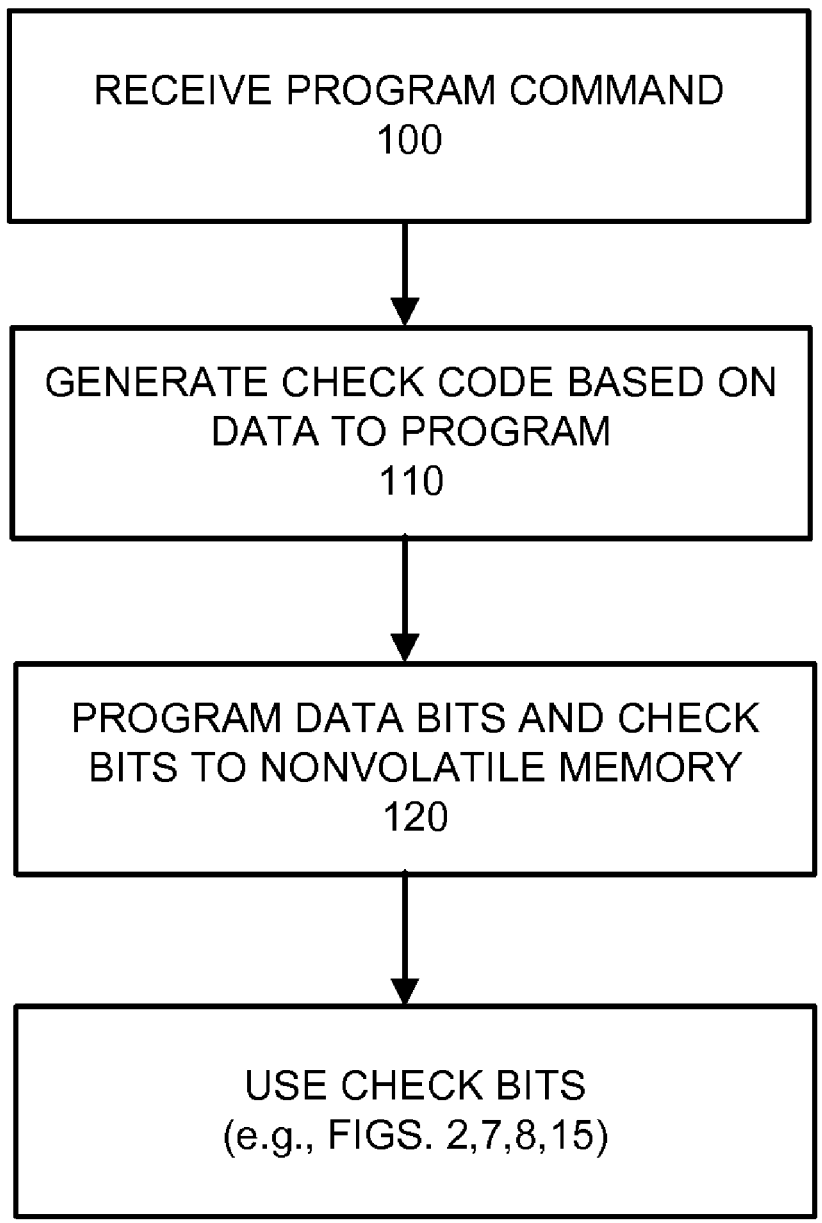
FIG. 1 is an exemplary flow chart of a program command, showing programming of data as well as a check code based on the data.

FIG. 1 is an exemplary flow chart of a program command, showing programming of data as well as a check code based on the data.

In 100, the nonvolatile memory integrated circuit receives a program command. In 110, a check code is generated based on data to be programmed by the program command. In various embodiments, the check code is an error correction code or error detection code. Examples of such codes are block codes (Hamming, Reed-Solomon, Reed-Muller, Goppa, Bose-Chaudhury-Hocquenhem, low density parity check), convolutional codes (turbo, Galileo), concatenated code, and interleaved codes. Other examples are single-error-correction double-error-detection codes, single-error-correction double-error-detection single-byte-error codes, single-byte-error-correction double-byte-error-detection, and double-error-correction triple-error-detection. The ability of various embodiments to detect or correct errors is partly dependent on the code algorithm of the particular embodiment.

In 120, both the program bits and the check code bite generated in 110 are programmed to the nonvolatile memory integrated circuit. The check code written in 120 is used in a read command, for example as shown in FIGS. 2, 7, 8, and 15.

Figure 2:
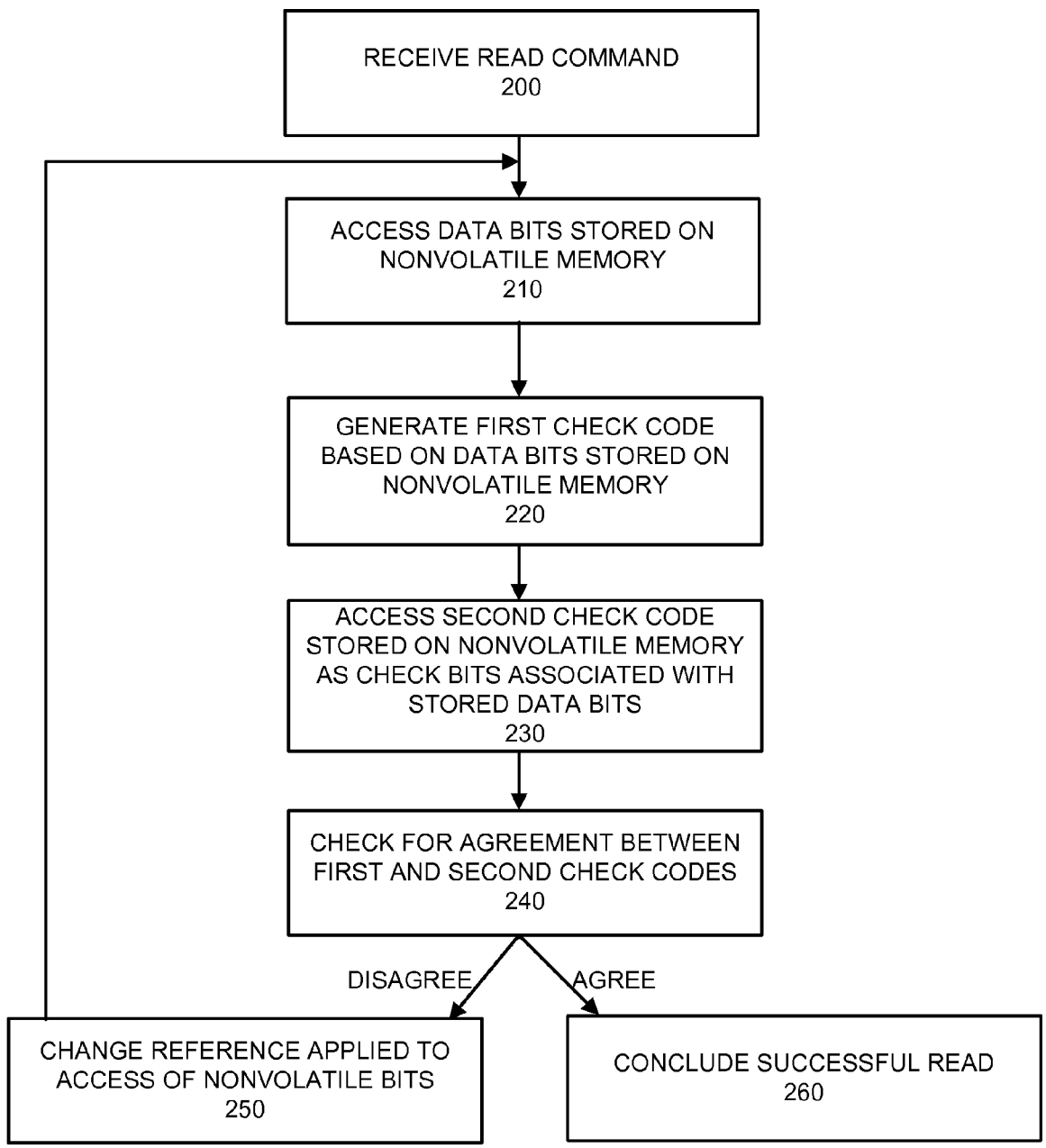
FIG. 2 is an exemplary flow chart of a read command, showing that a read reference is changed in response to a disagreement between a previously generated and programmed check code, and a new check code.

FIG. 2 is an exemplary flow chart of a read command, showing that a read reference is changed in response to a disagreement between a previously generated and programmed check code, and a new check code.

In 200, the nonvolatile memory integrated circuit receives a read command. In 210, the data bits programmed to the nonvolatile memory integrated circuit during 120 of FIG. 1 are accessed, using a reference to determine the logical levels represented by these data bits. In 220, a first check code is generated, based on the data bits that are accessed during 210. In 230, a second check code is accessed. The second check code is associated with the data bits read accessed in 210. The second check code was previously programmed to the nonvolatile memory integrated circuit in association with the programming of the data associated with the generation of the second check code, such as in 120 of FIG. 1.

In 240, agreement is checked, between the first check code generated in 220 and the second code accessed in 230. If the first check code and second check code agree, then in 260 a successful read is concluded. However, if the first check code and second check code disagree, then the reference used in 210 is changed, and the flow chart loops back to 210. In response to continued errors, the loop may repeat as many as 3 to 10 times. If the reference is a reference current used by a sense amplifier to compare against a bit line current from a memory cell, then the reference current is changed, such as by changing the gate voltage of the reference cell or changing the timing of the sense amplifier circuitry. An exemplary magnitude of current change in the reference current is about 1 uA. In various embodiments, the changed reference may be used or not be used in accessing the second check code.

Figure 7:
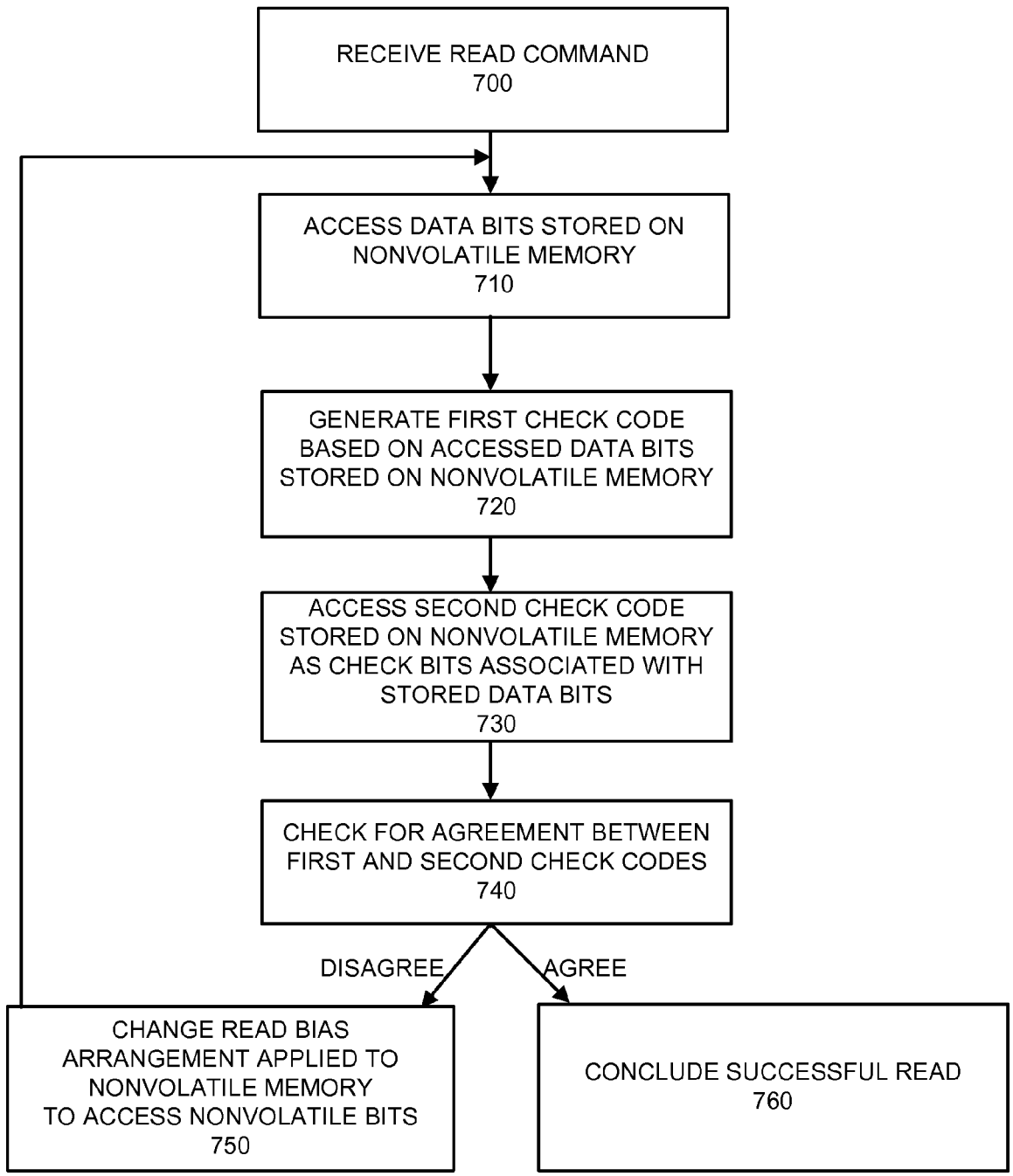
FIG. 7 is an exemplary flow chart of a read command, showing that a read bias arrangement is changed in response to a disagreement between a previously generated and programmed check code, and a new check code.

FIG. 7 is another exemplary flow chart of a read command, showing that a read bias arrangement is changed in response to a disagreement between a previously generated and programmed check code, and a new check code.

The flow chart of FIG. 7 is generally similar to the flow chart of FIG. 2. However, in 750, in response to disagreement between the first check code and the second check code, a change is made to the read bias arrangement, such as changing the word line voltage of the read bias arrangement. This read bias arrangement is applied to the nonvolatile memory to access the previously programmed data bits.

Figure 8:
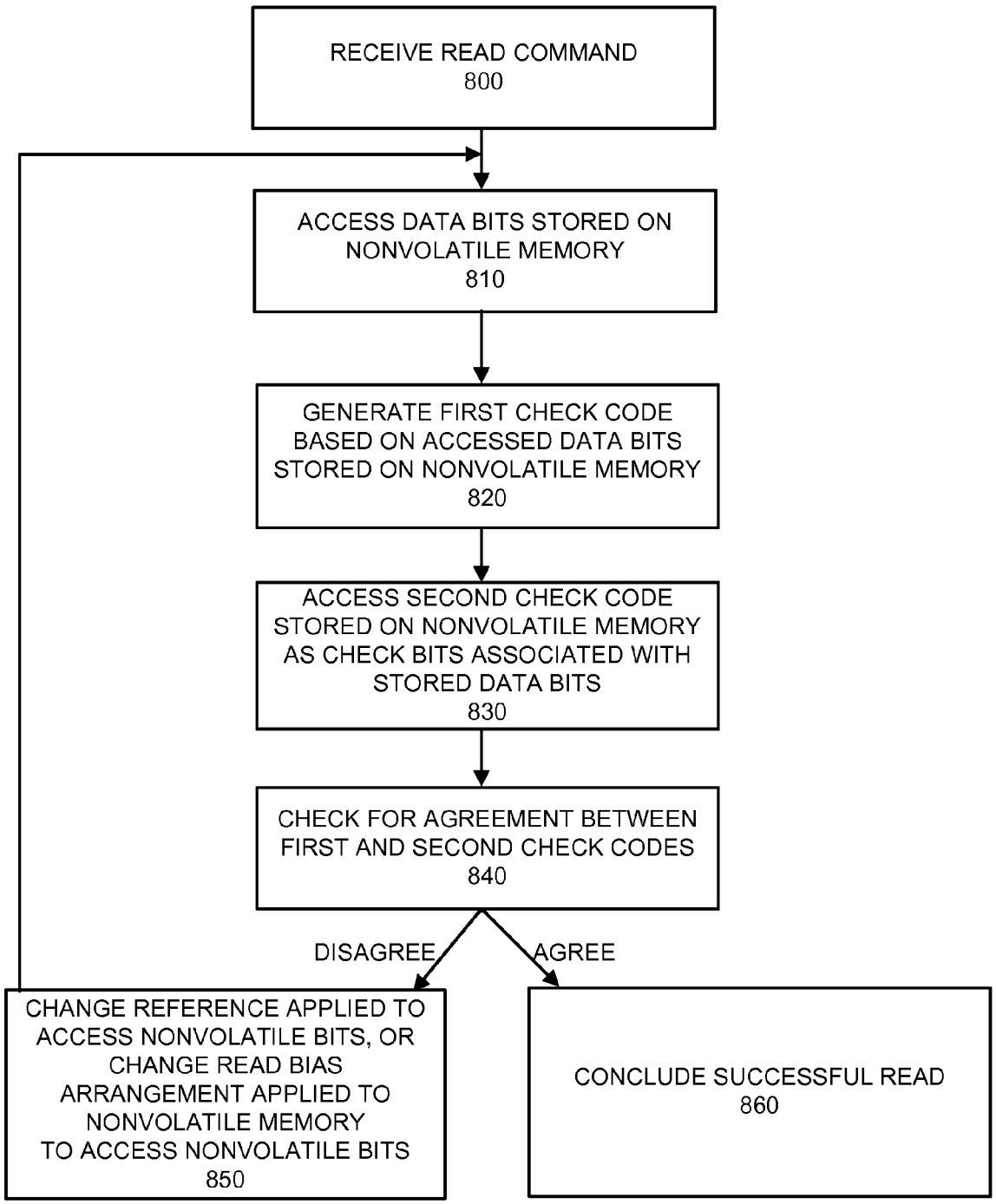
FIG. 8 is an exemplary flow chart of a read command, showing that a read reference and a read bias arrangement are changed in response to a disagreement between a previously generated and programmed check code, and a new check code.

FIG. 8 is yet another exemplary flow chart of a read command, showing that a read reference and a read bias arrangement are changed in response to a disagreement between a previously generated and programmed check code, and a new check code.

The flow chart of FIG. 8 is generally similar to the flow charts of FIGS. 2 and 7. However, in 850, in response to disagreement between the first check code and the second check code, a change is made by selecting one of changing the reference and changing the read bias arrangement. This changed reference is subsequently used in 810, when the flow chart loops back to 810. In response to continued errors, the loop may repeat as many as 3 to 10 times. If the reference is a reference current used by a sense amplifier to compare against a bit line current from a memory cell, then the reference current is changed, such as by changing the gate voltage of the reference cell or changing the timing of the sense amplifier circuitry. An exemplary magnitude of current change in the reference current is about 1 uA. In various embodiments, the changed reference may be used or not be used in accessing the second check code.

Figure 15:
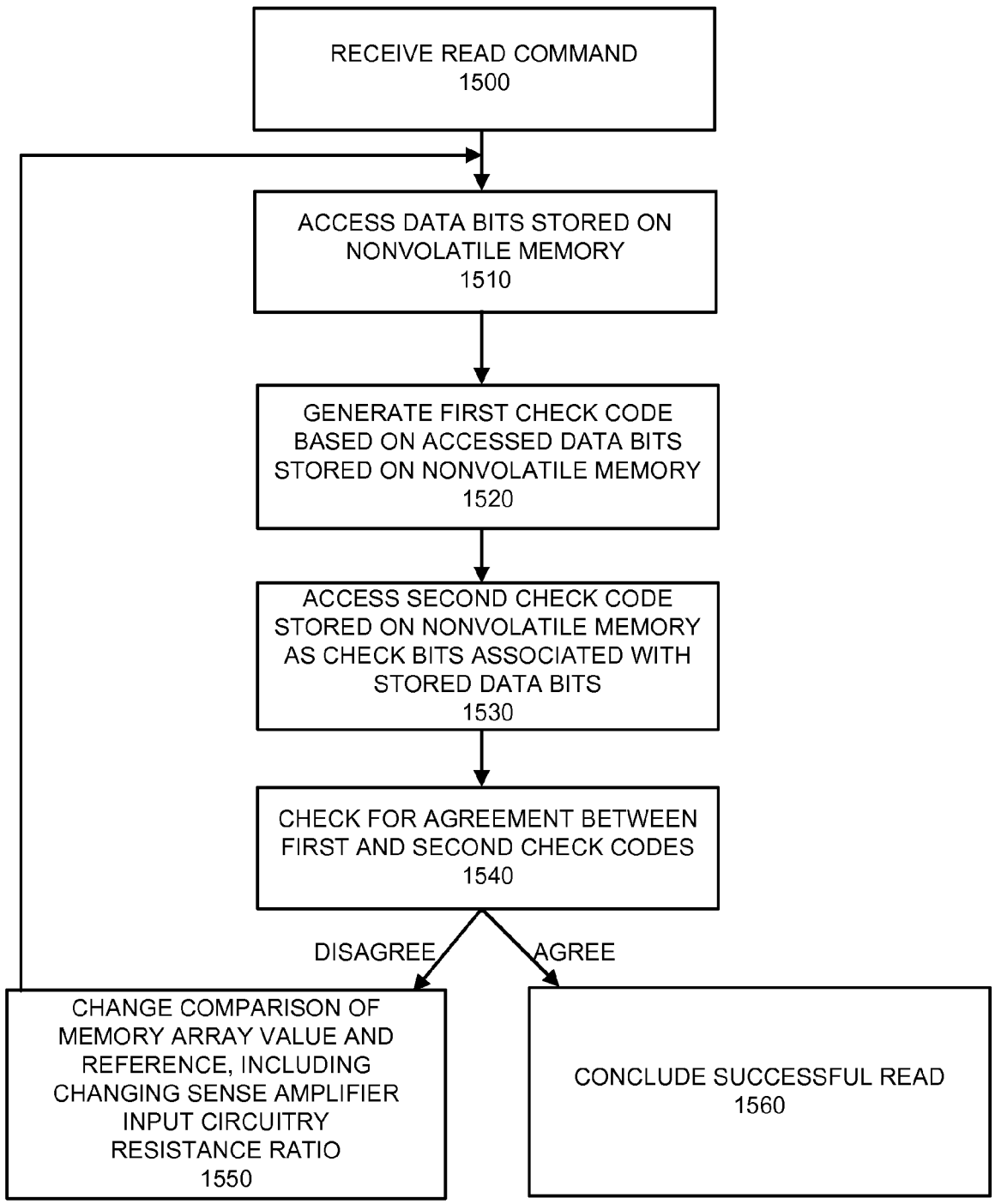
FIG. 15 is an exemplary flow chart of a read command, showing that a comparison of a memory array value and a reference is changed in response to a disagreement between a previously generated and programmed check code and a new check code, where at least the sense amplifier input circuitry resistance ratio is changed.

FIG. 15 is an exemplary flow chart of a read command, showing that a comparison of a memory array value and a reference is changed in response to a disagreement between a previously generated and programmed check code and a new check code, where at least the sense amplifier input circuitry resistance ratio is changed.

Figure 12:
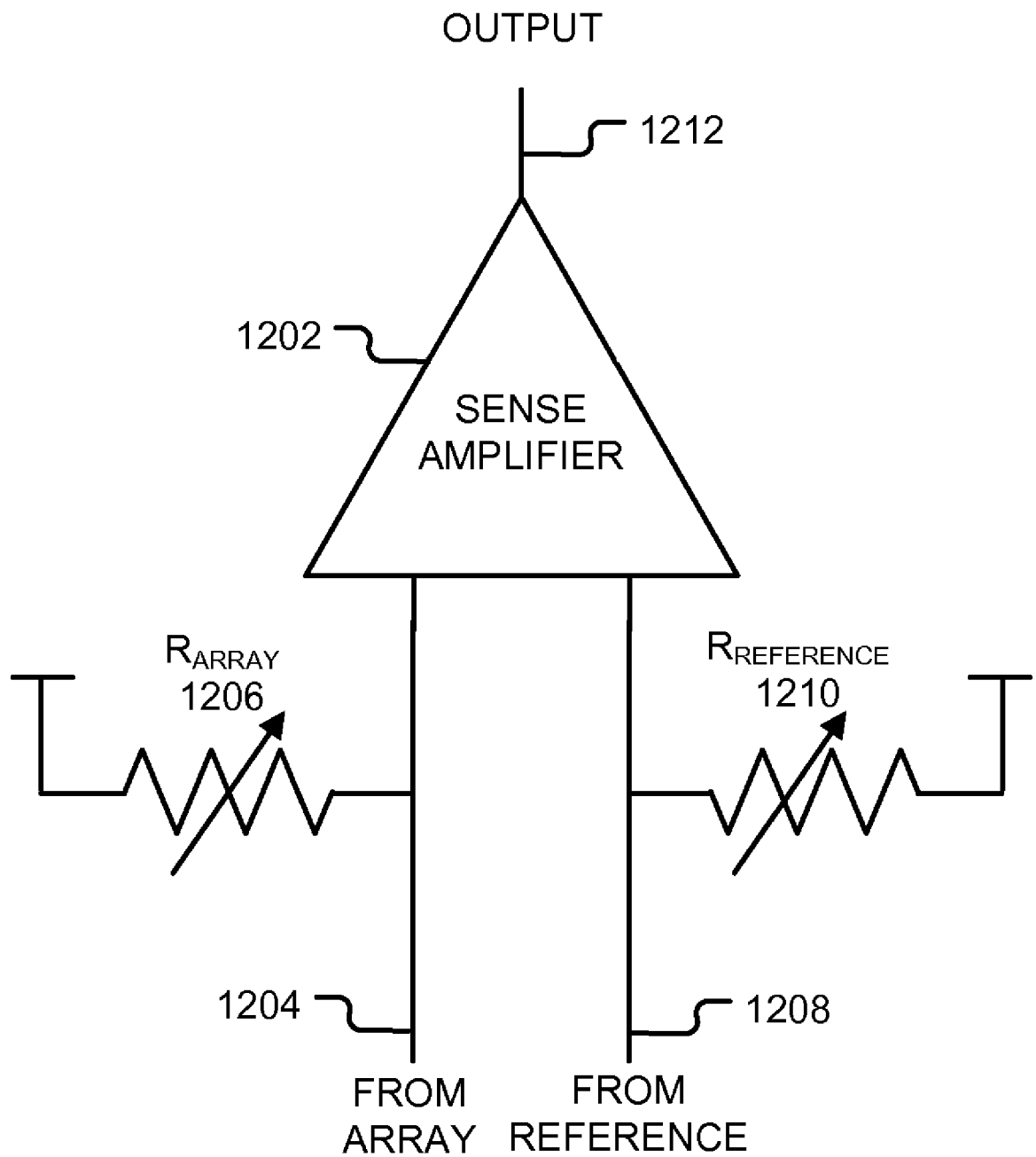
FIG. 12 shows an exemplary block diagram of sense amplifier circuitry, with variable resistance in the input circuits of both the signal from the memory array and the signal from the reference.
Figure 13:
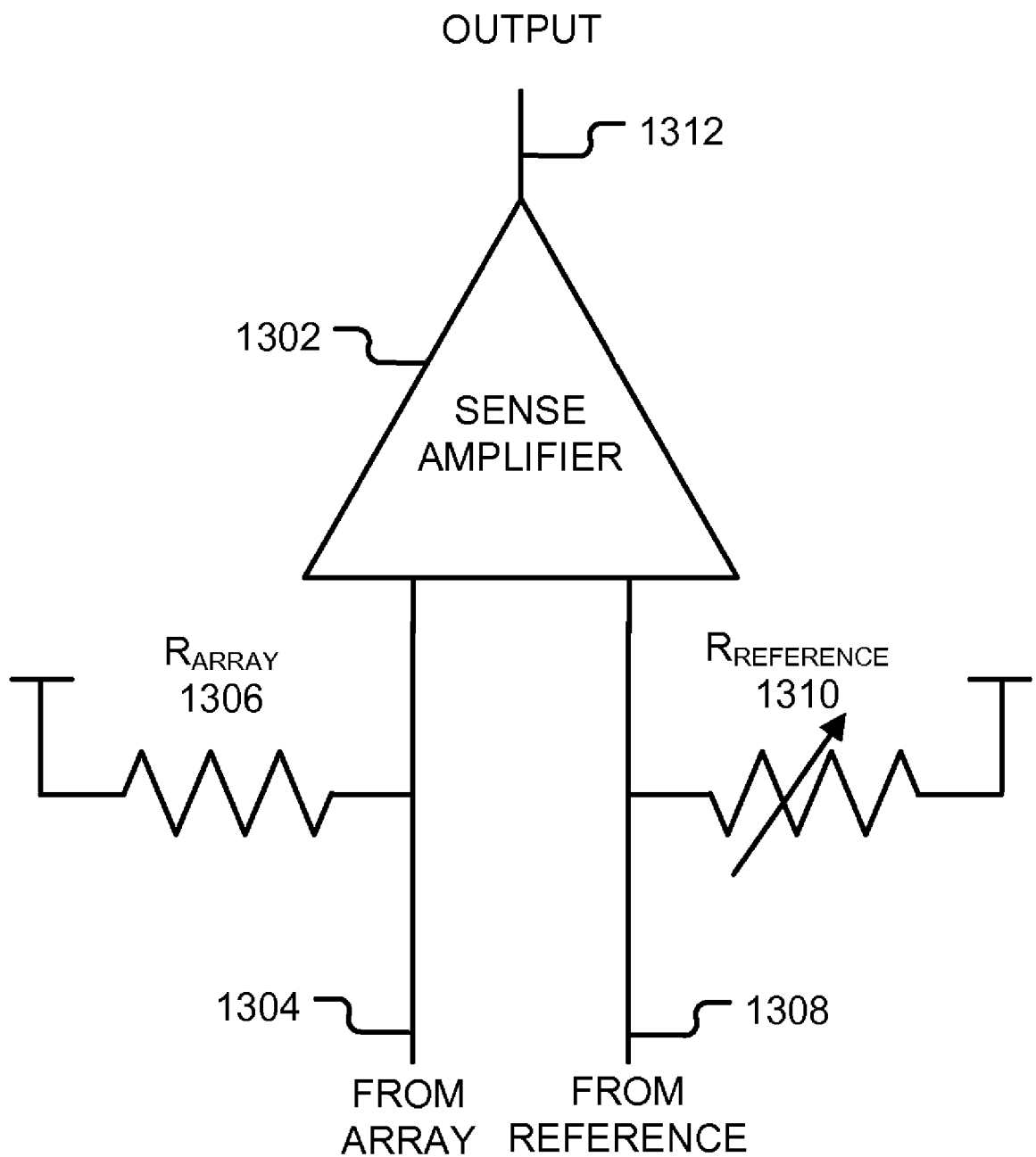
FIG. 13 shows an exemplary block diagram of sense amplifier circuitry, with variable resistance in the input circuit of the signal from the reference.
Figure 14:
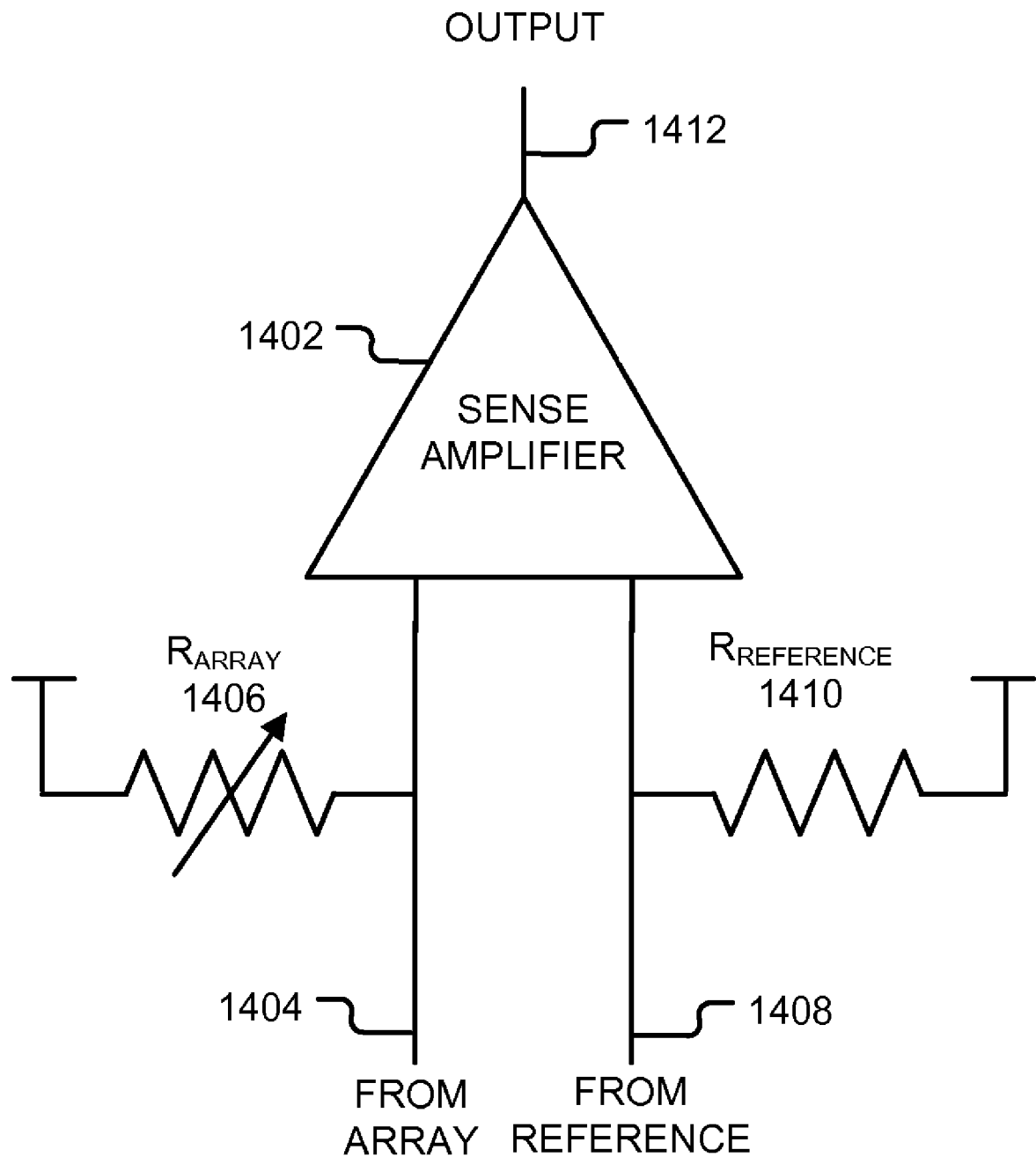
FIG. 14 shows an exemplary block diagram of sense amplifier circuitry, with variable resistance in the input circuits of the signal from the memory array.

The flow chart of FIG. 15 is generally similar to the flow charts of FIGS. 2, 7, and 8. However, in 1550, in response to disagreement between the first check code and the second check code, the comparison (of the memory array value and the reference) is changed, by at least changing the resistance ratio (also called sensing ratio). Examples of the ratio are shown in FIGS. 12-14. This changed ratio with the resulting changed sensing window (examples shown in FIGS. 16-18) is subsequently used in 1510, when the flow chart loops back to 1510. In response to continued errors, the loop may repeat as many as 3 to 10 times. Other changes may accompany the changed ratio, such as changing the reference and the read bias arrangement. If the reference is a reference current used by a sense amplifier to compare against a bit line current from a memory cell, then the reference current is changed, such as by changing the gate voltage of the reference cell or changing the timing of the sense amplifier circuitry. An exemplary magnitude of current change in the reference current is about 1 uA. In various embodiments, the changed reference may be used or not be used in accessing the second check code.

In another embodiment, the in response to disagreement between the first check code and the second check code, a change is made by both changing the reference and changing the read bias arrangement.

An example of changing the read bias arrangement is changing the word line voltage of the read bias arrangement. This read bias arrangement is applied to the nonvolatile memory to access the previously programmed data bits in 810.

The flow charts of FIGS. 1, 2, 7, 8, and 15 are exemplary. In other embodiments, the steps shown are rearranged, modified, deleted, or added to. For example, the steps of accessing data bits and accessing the second check code may be combined in a single step.

Figure 3:
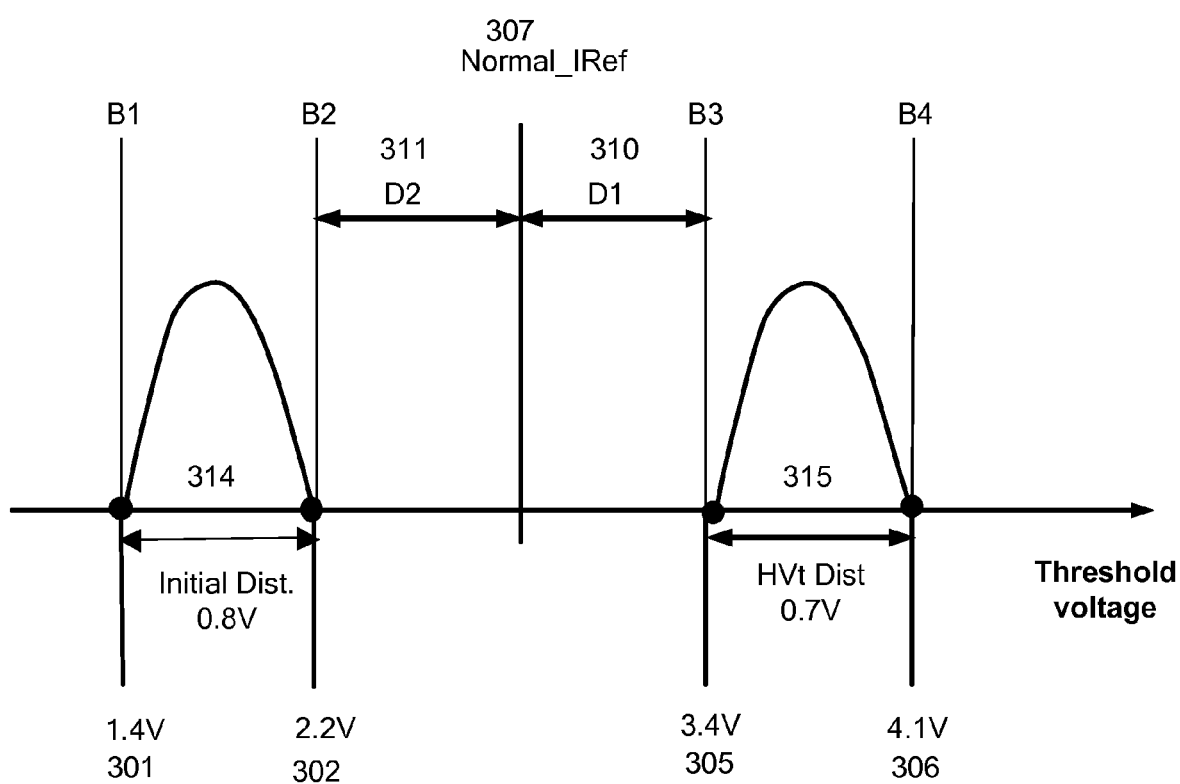
FIG. 3 shows an exemplary threshold voltage algorithm.
Figure 4:
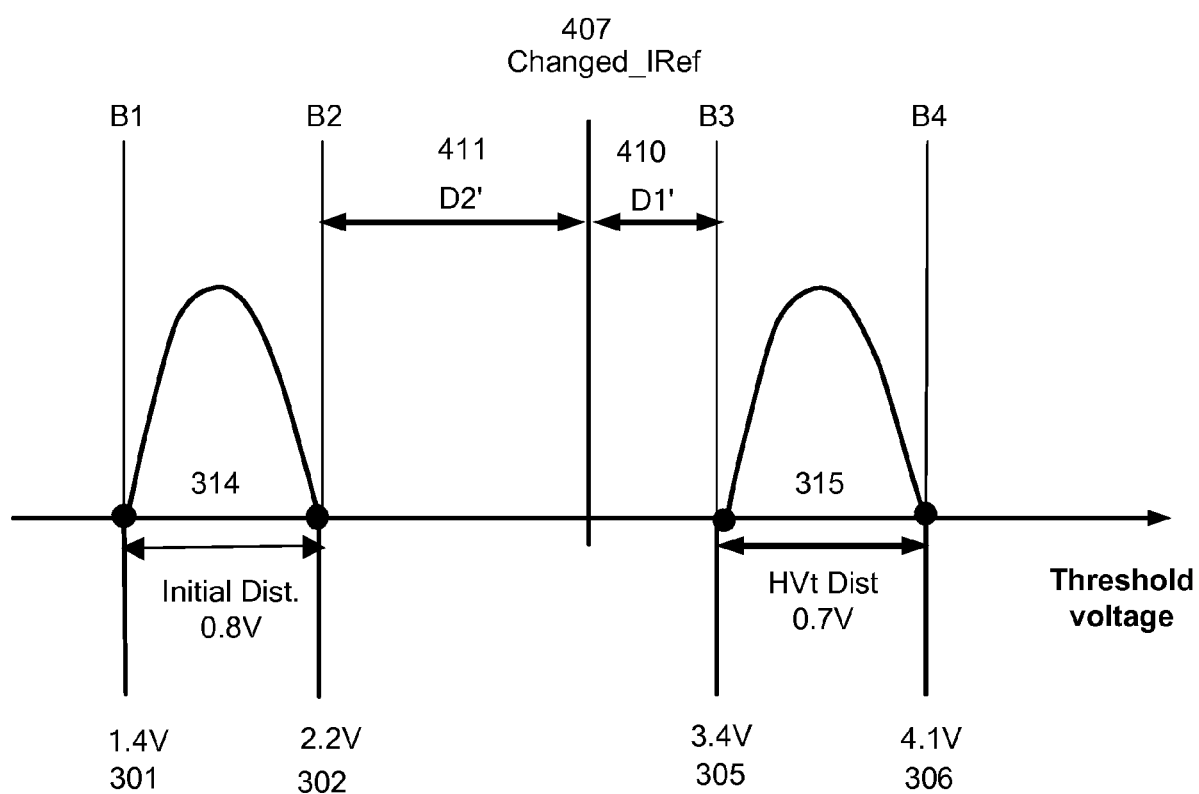
FIG. 4 shows an exemplary threshold voltage algorithm, similar to FIG. 3 but with a changed current reference, favoring a low threshold voltage distribution in contrast with FIG. 3.
Figure 5:
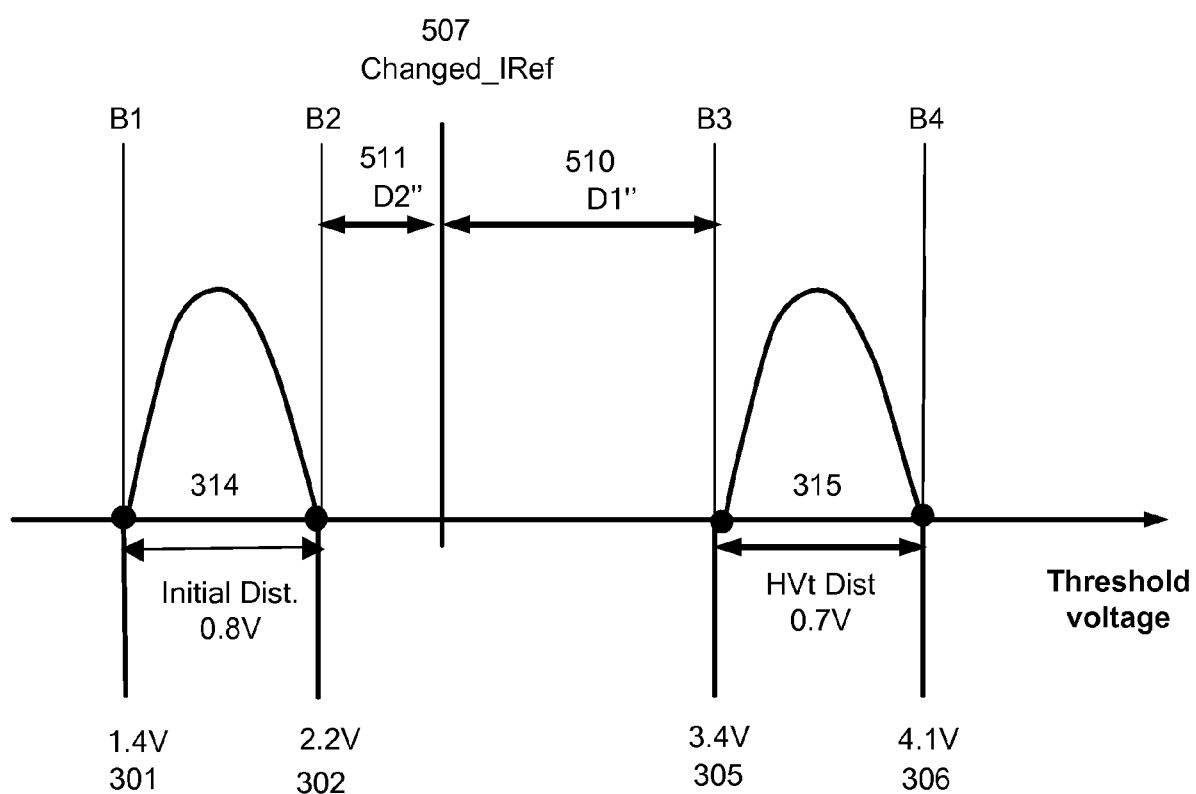
FIG. 5 shows an exemplary threshold voltage algorithm, similar to FIG. 3 but with another changed current reference, favoring a high threshold voltage distribution in contrast with FIG. 3.

FIGS. 3-5 show the effect of changing the current reference in an exemplary threshold voltage algorithm FIG. 3 shows the baseline of an exemplary threshold voltage algorithm.

301 is the low bound of the low threshold voltage distribution B1. 302 is the high bound of the low threshold voltage distribution B2. 305 is the low bound of the high threshold voltage distribution B3. 306 is the high bound of the high threshold voltage distribution B4. A sense amplifier will sense the memory data by using a normal_Iref 307 and have a margin D1 310 for charge loss of high threshold voltage cells and margin D2 311 for charge gain of low threshold voltage cells. Although only two logical levels are shown, other embodiments have four or more logical levels to represent two or more bits.

FIG. 4 shows an exemplary threshold voltage algorithm, similar to FIG. 3 but with a changed current reference, favoring a low threshold voltage distribution in contrast with FIG. 3.

The changed current reference Changed_IRef 407 was changed in response to a disagreement between check codes, such as in 240 of FIG. 2. Changed_IRef 407 has a narrower sensing margin D1' 410 compared to D1 310 and a wider sensing margin D2' 411 compared to D2 311, so Changed_IRef 407 has a smaller sensing window for high threshold voltage cells and a larger sensing window for low threshold voltage cells. In the event of excess net negative charge gain by the charge storage material of the nonvolatile memory cells, the threshold voltage will be incorrectly raised. Therefore, Changed_IRef 407 will be more likely to result in a correct determination of the represented logical level.

FIG. 5 shows an exemplary threshold voltage algorithm, similar to FIG. 3 but with another changed current reference, favoring a high threshold voltage distribution in contrast with FIG. 3.

Similar but opposite to FIG. 4, Changed_IRef 507 has a wider sensing margin D1" 510 compared to D1 310 and a narrower sensing margin D2" 511 compared to D2 311, so Changed_IRef has a smaller sensing window for low threshold voltage cells and a larger sensing window for high threshold voltage cells. In the event of excess net positive charge gain by the charge storage material of the nonvolatile memory cells, the threshold voltage will be incorrectly lowered. Therefore, Changed_IRef 507 will be more likely to result in a correct determination of the represented logical level.

In another embodiment, net positive charge gain results in changing the reference to favor the lower threshold voltage cells, and net negative charge gain results in changing the reference to favor the higher threshold voltage cells.

Figure 6:
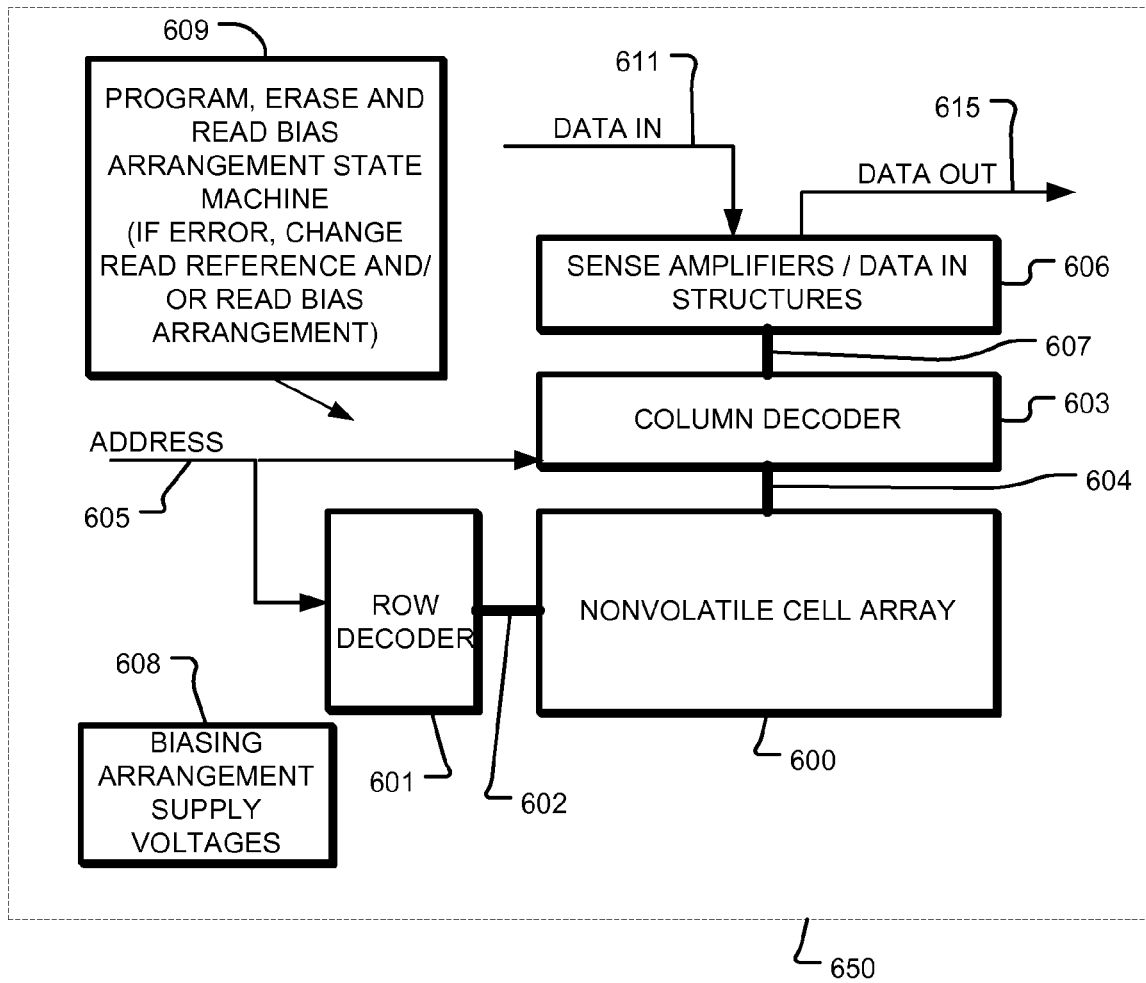
FIG. 6 shows an exemplary block diagram of a nonvolatile memory integrated circuit that changes a comparison of a reference and a memory array signal in response to an error, such as disagreement between check codes as disclosed herein.

FIG. 6 shows an exemplary block diagram of a nonvolatile memory integrated circuit that changes a comparison of a reference and a memory array signal in response to an error, such as disagreement between check codes as disclosed herein.

The integrated circuit 650 includes a memory array 600 of nonvolatile memory cells, on a semiconductor substrate. The memory cells of array 600 may be individual cells, interconnected in arrays, or interconnected in multiple arrays. A row decoder 601 is coupled to a plurality of word lines 602 arranged along rows in the memory array 600. A column decoder 603 is coupled to a plurality of bit lines 604 arranged along columns in the memory array 600. Addresses are supplied on bus 605 to column decoder 603 and row decoder 601. Sense amplifier and data-in structures 606 are coupled to the column decoder 603 via data bus 607. In many embodiments, the sense amplifier performs the comparison between the reference value and the stored value retrieved by applying a read bias arrangement to the memory array 600. In some embodiments, a resistance ratio of the sense amplifier inputs is adjusted to adjust the sensing window. Data is supplied via the data-in line 611 from input/output ports on the integrated circuit 650, or from other data sources internal or external to the integrated circuit 650, to the data-in structures in block 606. Data is supplied via the data-out line 615 from the sense amplifiers in block 606 to input/output ports on the integrated circuit 650, or to other data destinations internal or external to the integrated circuit 650. A bias arrangement state machine 609 controls the application of bias arrangement supply voltages 608, such as for the erase verify and program verify voltages, and the arrangements for programming, erasing, and reading the memory cells. The bias arrangement state machine 609 causes the reference used by the sense amplifiers of block 606 to change in response to an error in comparison between check codes, as disclosed herein. Alternatively, the bias arrangement state machine 609 causes the read bias arrangement applied by the bias arrangement supply voltages 608 to the nonvolatile cell array 600 to change (e.g., a change to one or more word line voltages, and/or or one or more bit lines voltages) in response to an error in comparison between check codes, as disclosed herein. In yet another embodiment, both the reference used by the sense amplifiers of block 606 and the read bias arrangement applied by the bias arrangement supply voltages 608 are changed in response to an error in comparison between check codes, as disclosed herein.

Figure 9:
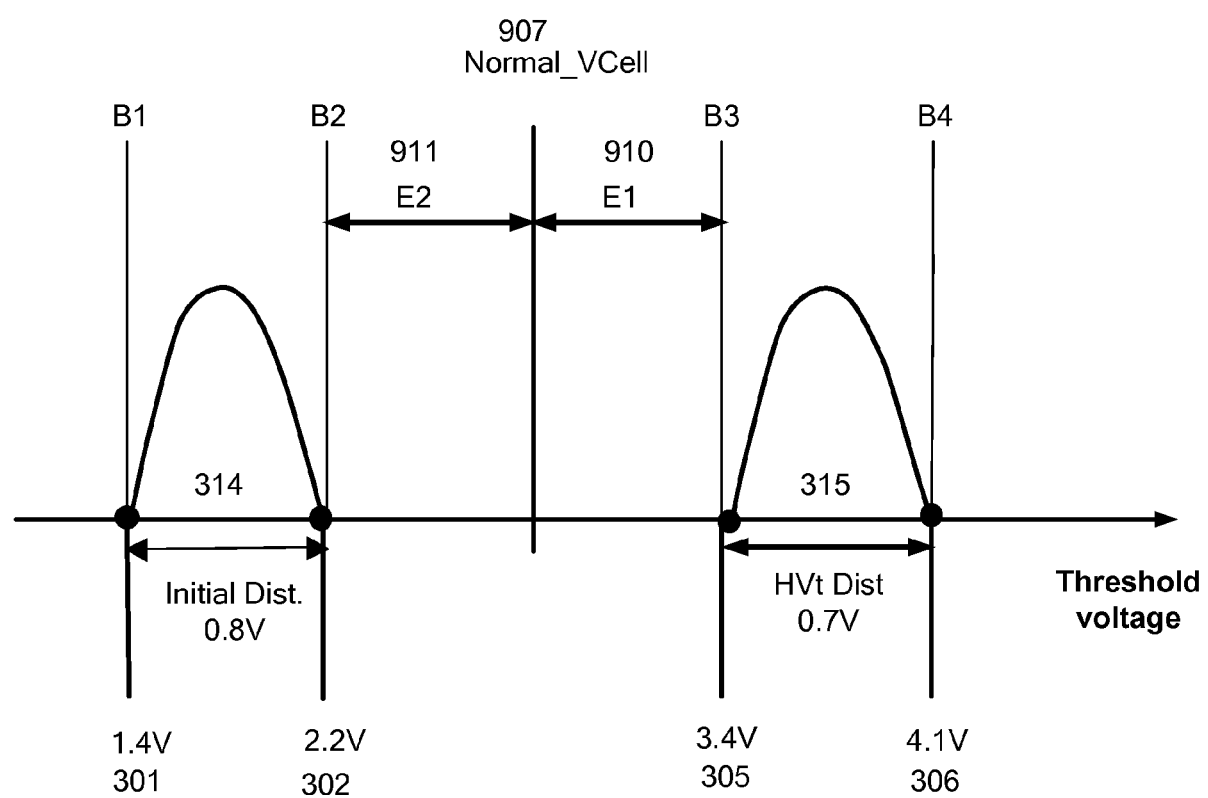
FIG. 9 shows another exemplary threshold voltage algorithm.
Figure 10:
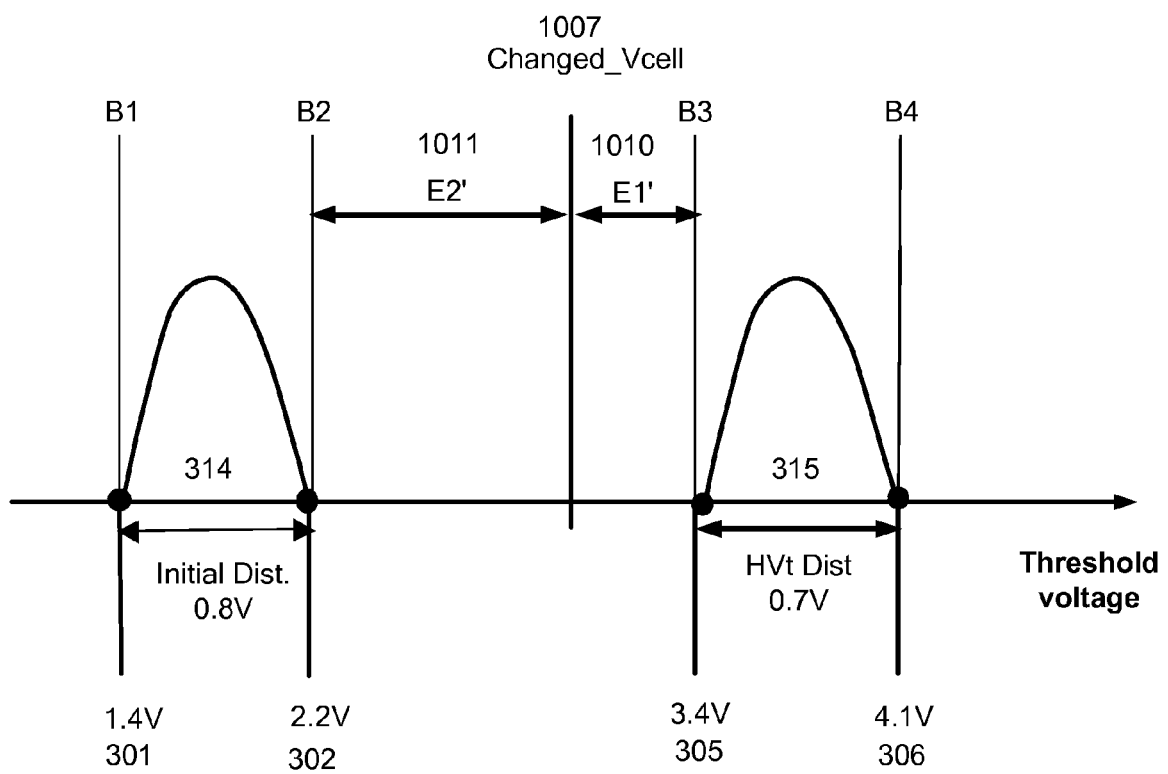
FIG. 10 shows an exemplary threshold voltage algorithm, similar to FIG. 9 but with a changed read bias arrangement, favoring a low threshold voltage distribution in contrast with FIG. 9.
Figure 11:
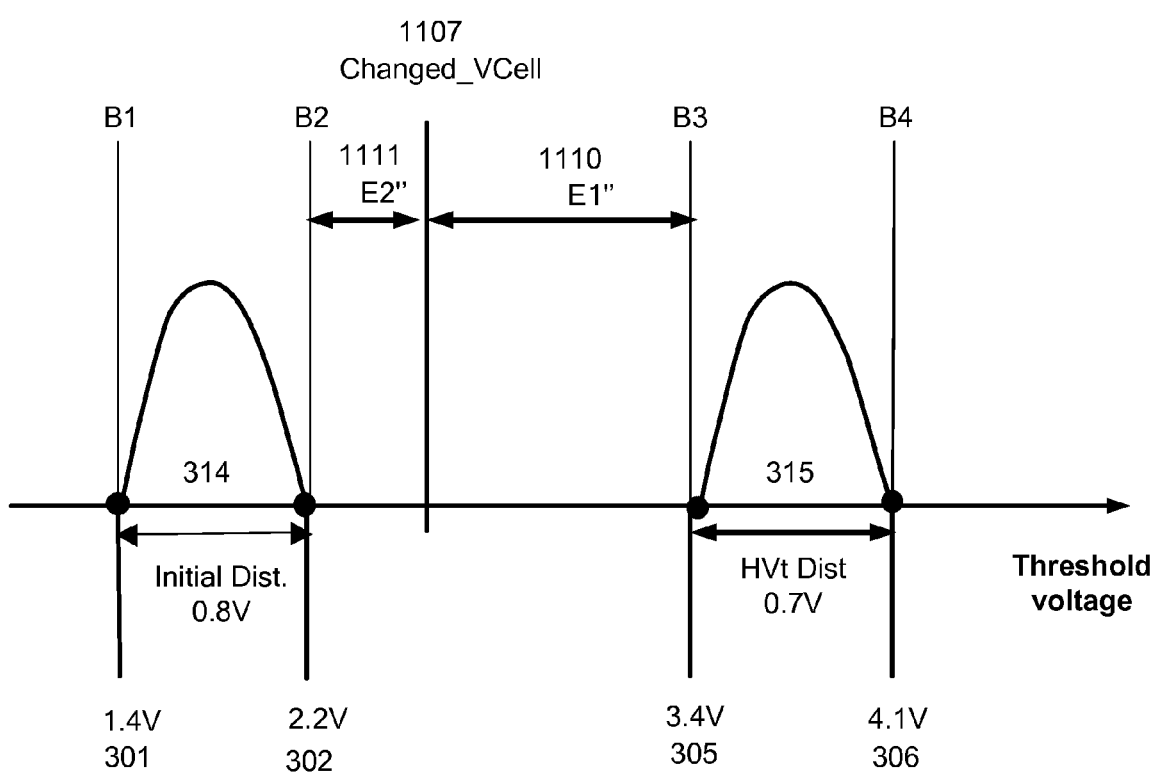
FIG. 11 shows an exemplary threshold voltage algorithm, similar to FIG. 9 but with another changed read bias arrangement, favoring a high threshold voltage distribution in contrast with FIG. 9.

FIGS. 9-11 show the effect of changing the word line voltage of the read bias arrangement in an exemplary threshold voltage algorithm FIG. 9 shows the baseline exemplary threshold voltage algorithm.

301 is the low bound of the low threshold voltage distribution B1. 302 is the high bound of the low threshold voltage distribution B2. 305 is the low bound of the high threshold voltage distribution B3. 306 is the high bound of the high threshold voltage distribution B4. A read bias arrangement will sense the memory data by applying a world line voltage Normal_VCell 907 and have a margin E1 910 for charge loss of high threshold voltage cells and margin E2 911 for charge gain of low threshold voltage cells. Although only two logical levels are shown, other embodiments have four or more logical levels to represent two or more bits.

FIG. 10 shows an exemplary threshold voltage algorithm, similar to FIG. 9 but with a changed read bias arrangement, favoring a low threshold voltage distribution in contrast with FIG. 9.

The changed word line voltage Changed_Vcell 1007 was changed in response to a disagreement between check codes, such as in 740 of FIG. 7 or 840 of FIG. 8. Changed_Vcell 1007 has a narrower read margin E1' 1010 compared to E1 910 and a wider read margin E2' 1011 compared to E2 911, so Changed_Vcell 1007 has a smaller read window for high threshold voltage cells and a larger read window for low threshold voltage cells. In the event of excess net negative charge gain by the charge storage material of the nonvolatile memory cells, the threshold voltage will be incorrectly raised. Therefore, Changed_Vcell 1007 will be more likely to result in a correct determination of the represented logical level.

FIG. 11 shows an exemplary threshold voltage algorithm, similar to FIG. 9 but with another changed read bias arrangement, favoring a high threshold voltage distribution in contrast with FIG. 9.

Similar but opposite to FIG. 10, Changed_Vcell 1107 has a wider read margin E1"1110 compared to E1 910 and a narrower read margin E2" 1111 compared to E2 911, so Changed_Vcell 1107 has a smaller read window for low threshold voltage cells and a larger read window for high threshold voltage cells. In the event of excess net positive charge gain by the charge storage material of the nonvolatile memory cells, the threshold voltage will be incorrectly lowered. Therefore, Changed_Vcell 1107 will be more likely to result in a correct determination of the represented logical level.

In another embodiment, net positive charge gain results in changing the reference to favor the lower threshold voltage cells, and net negative charge gain results in changing the reference to favor the higher threshold voltage cells.

Figure 16:
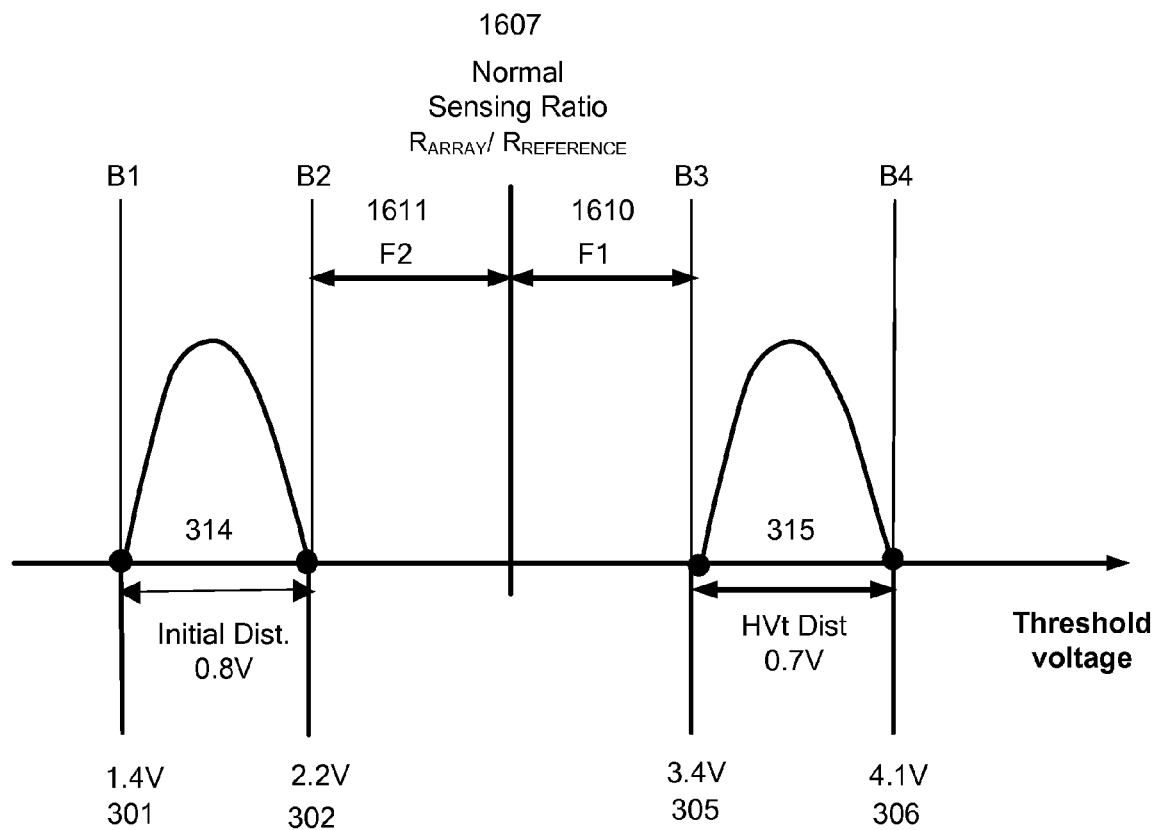
FIG. 16 shows yet another exemplary threshold voltage algorithm.
Figure 17:
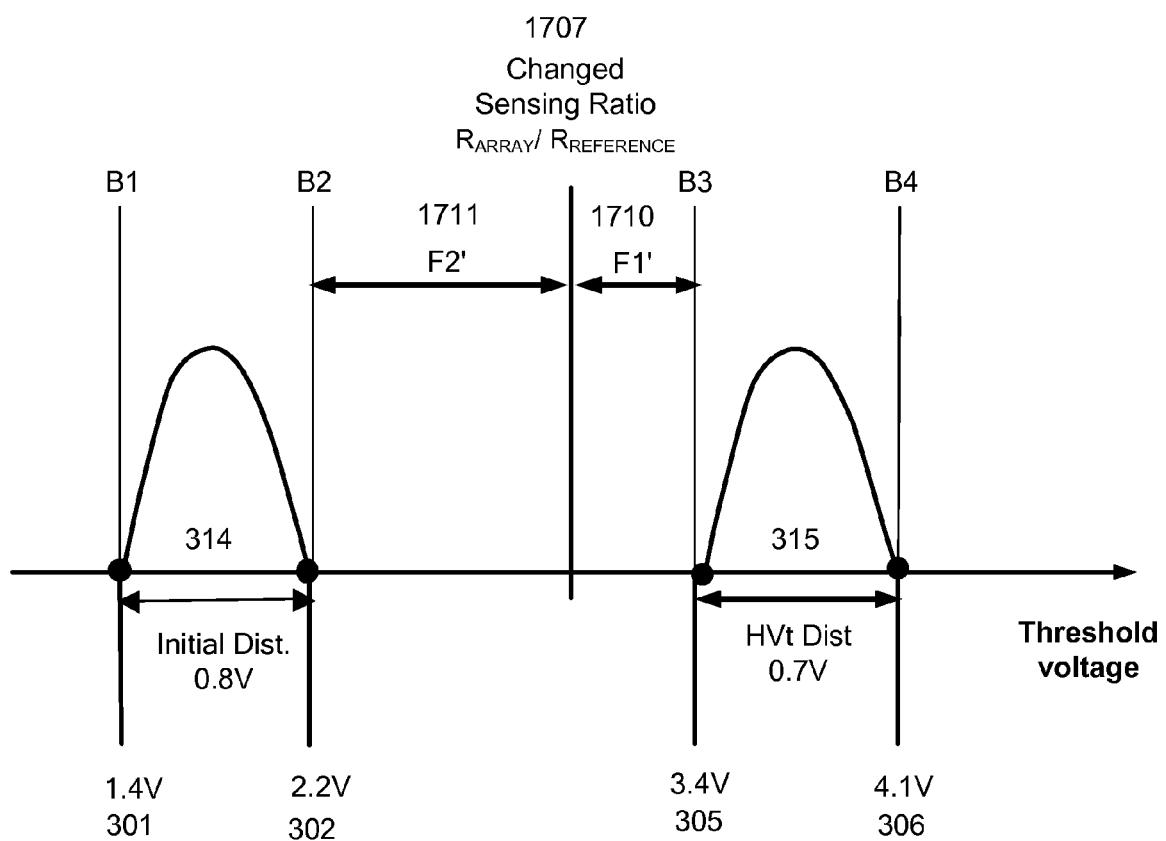
FIG. 17 shows an exemplary threshold voltage algorithm, similar to FIG. 16 but with a changed sensing ratio, favoring a low threshold voltage distribution in contrast with FIG. 16.
Figure 18:
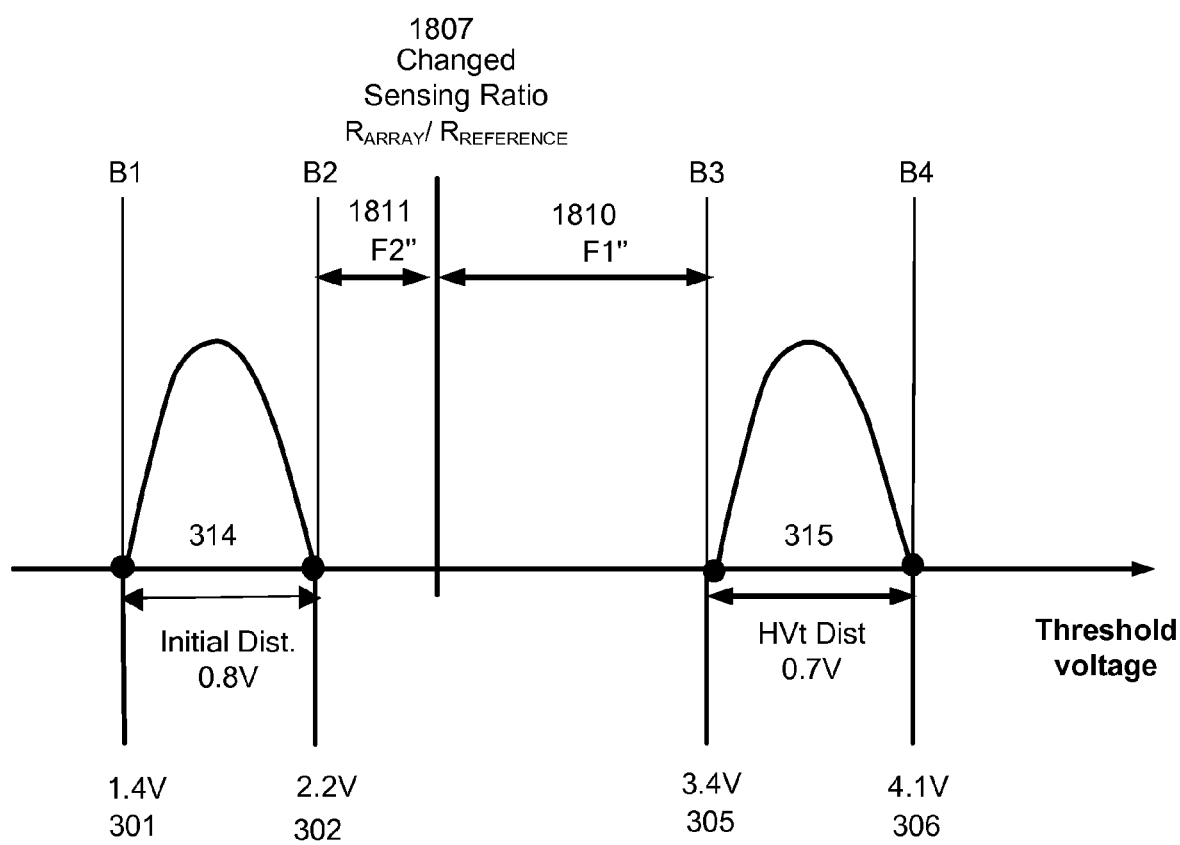
FIG. 18 shows an exemplary threshold voltage algorithm, similar to FIG. 16 but with another changed sensing ratio, favoring a high threshold voltage distribution in contrast with FIG. 16.

FIGS. 12-14 show example block diagrams of sense amplifier circuitry with variable resistance in the input circuits to change a sensing ratio. In one embodiment, a variable resistance is implemented with a transistor configured as a variable resistor. In one embodiment, such sense amplifier circuitry is included in the sense amplifier block 606 of FIG. 6. Example effects of changing the sensing ratio are shown in FIGS. 16-18.

FIG. 12 shows an exemplary block diagram of sense amplifier circuitry, with variable resistance in the input circuits of both the signal from the memory array and the signal from the reference.

The sense amplifier 1202 has a first input 1204 from the memory array, and a second input 1208 from the reference. The first input 1204 is part of a first input circuit including a variable resistance $R_{ARRAY}$ 1206. The second input 1208 is part of a second input circuit including a variable resistance $R_{REFERENCE}$ 1210. The first and second input circuits adjust the sensing window as shown in FIGS. 16-18, and the sensing ratio is expressed as $R_{ARRAY}/R_{REFERENCE}$. The output 1212 indicates result of the comparison of the two inputs and determines the data value stored in the memory.

FIG. 13 shows an exemplary block diagram of sense amplifier circuitry, with variable resistance in the input circuit of the signal from the reference.

The sense amplifier 1302 has a first input 1304 from the memory array, and a second input 1308 from the reference. The first input 1304 is part of a first input circuit including a fixed resistance $R_{ARRAY}$ 1306. The second input 1308 is part of a second input circuit including a variable resistance $R_{REFERENCE}$ 1310. The first and second input circuits adjust the sensing window as shown in FIGS. 16-18, and the sensing ratio is expressed as $R_{ARRAY}/R_{REFERENCE}$. The output 1312 indicates result of the comparison of the two inputs and determines the data value stored in the memory.

FIG. 14 shows an exemplary block diagram of sense amplifier circuitry, with variable resistance in the input circuits of the signal from the memory array.

The sense amplifier 1402 has a first input 1404 from the memory array, and a second input 1408 from the reference. The first input 1404 is part of a first input circuit including a variable resistance $R_{ARRAY}$ 1406. The second input 1408 is part of a second input circuit including a fixed resistance $R_{REFERENCE}$ 1410. The first and second input circuits adjust the sensing window as shown in FIGS. 16-18, and the sensing ratio is expressed as $R_{ARRAY}/R_{REFERENCE}$. The output 1412 indicates result of the comparison of the two inputs and determines the data value stored in the memory.

FIGS. 16-18 show the effect of changing the sensing ratio of the sense amplifier input circuitry in an exemplary threshold voltage algorithm FIG. 16 shows yet another exemplary threshold voltage algorithm.

301 is the low bound of the low threshold voltage distribution B1. 302 is the high bound of the low threshold voltage distribution B2. 305 is the low bound of the high threshold voltage distribution B3. 306 is the high bound of the high threshold voltage distribution B4. A read bias arrangement will sense the memory data by applying a world line voltage Normal Sensing Ratio $R_{ARRAY}/R_{REFERENCE}$ 1607 and have a margin F1 1610 for charge loss of high threshold voltage cells and margin F2 1611 for charge gain of low threshold voltage cells. Although only two logical levels are shown, other embodiments have four or more logical levels to represent two or more bits.

FIG. 17 shows an exemplary threshold voltage algorithm, similar to FIG. 16 but with a changed sensing ratio, favoring a low threshold voltage distribution in contrast with FIG. 16.

The Changed Sensing Ratio $R_{ARRAY}/R_{REFERENCE}$ 1707 was changed in response to a disagreement between check codes, such as in 1540 of FIG. 15. Changed Sensing Ratio $R_{ARRAY}/R_{REFERENCE}$ 1707 has a narrower read margin F1' 1710 compared to F1 1610 and a wider read margin F2' 1711 compared to F2 1611, so Changed Sensing Ratio $R_{ARRAY}/R_{REFERENCE}$ 1707 has a smaller read window for high threshold voltage cells and a larger read window for low threshold voltage cells. In the event of excess net negative charge gain by the charge storage material of the nonvolatile memory cells, the threshold voltage will be incorrectly raised. Therefore, Changed Sensing Ratio $R_{ARRAY}/R_{REFERENCE}$ 1707 will be more likely to result in a correct determination of the represented logical level.

FIG. 18 shows an exemplary threshold voltage algorithm, similar to FIG. 16 but with another changed sensing ratio, favoring a high threshold voltage distribution in contrast with FIG. 16.

Similar but opposite to FIG. 17, Changed Sensing Ratio $R_{ARRAY}/R_{REFERENCE}$ 1807 has a wider read margin F1" 1810 compared to F1 1610 and a narrower read margin F2" 1811 compared to F2 1611, so Changed Sensing Ratio $R_{ARRAY}/R_{REFERENCE}$ 1807 has a smaller read window for low threshold voltage cells and a larger read window for high threshold voltage cells. In the event of excess net positive charge gain by the charge storage material of the nonvolatile memory cells, the threshold voltage will be incorrectly lowered. Therefore, Changed Sensing Ratio $R_{ARRAY}/R_{REFERENCE}$ 1807 will be more likely to result in a correct determination of the represented logical level.

In another embodiment, net positive charge gain results in changing the reference to favor the lower threshold voltage cells, and net negative charge gain results in changing the reference to favor the higher threshold voltage cells.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of reading a memory, comprising:
   in response to a read command, the memory performing:
      generating a first check code based on accessing a plurality of data bits stored on the memory;
      accessing a second check code stored on the memory as a plurality of check bits associated with the plurality of data bits;
      checking whether the first check code and the second check code are in agreement; and
      responsive to disagreement between the first check code and the second check code, changing a comparison between i) at least one value representing at least one of the plurality of data bits stored on the memory, said at least one value accessed by a read bias arrangement applied on the memory, and ii) at least one reference applied to accesses of the data bits stored on the memory, said at least one reference and the comparison distinguishing between logical levels represented by said at least one value, including:
changing the comparison by changing a ratio of a first resistance and a second resistance, the first resistance characterizing a first input circuit of a sense amplifier that receives said at least one value, the second resistance characterizing a second input circuit of the sense amplifier that receives said at least one reference.

2. The method of claim 1, wherein said at least one value is a current representing said at least one of the plurality of data bits.

3. The method of claim 1, wherein said at least one value is a voltage representing said at least one of the plurality of data bits.

4. The method of claim 1, wherein the first check code and the second check code are error correcting codes.

5. The method of claim 1, wherein the first check code and the second check code are error detecting codes.

6. The method of claim 1, wherein said changing includes changing the read bias arrangement applied on the memory.

7. The method of claim 1, wherein said changing includes changing a word line voltage of the read bias arrangement applied on the memory.

8. The method of claim 1, wherein said changing includes changing i) said at least one reference and ii) the read bias arrangement applied on the memory.

9. The method of claim 1, the memory further performing:
after said changing the comparison, based on changing the comparison, repeating one or more of:
said generating the first check code;
said accessing the second check code; and
said checking whether the first check code and the second check code are in agreement.

10. The method of claim 1, the memory further performing:
after said changing the comparison, performing:
until success results from subsequent checking whether the first check code and the second check code are in agreement, iteratively changing the comparison.

11. The method of claim 1, wherein said at least one reference distinguishes between at least a first logical level and a second logical level of said logical levels,
wherein said at least one value is accessed to distinguish whether said at least one of the plurality of data bits represents the first logical level or the second logical level, and
said changing the comparison comprises:
widening a first range of the accessed values associated with the first logical level; and
narrowing a second range of the accessed values associated with the second logical level.

12. A memory, comprising:
a memory array; and
control circuitry coupled to the memory array, the control circuitry responsive to a read command by performing:
generating a first check code based on accessing a plurality of data bits stored on the memory array;
accessing a second check code stored on the memory as a plurality of check bits associated with the plurality of data bits;
checking whether the first check code and the second check code are in agreement;
responsive to disagreement between the first check code and the second check code, changing a comparison between i) at least one value representing at least one of the plurality of data bits stored on the memory array, said at least one value accessed by a read bias arrangement applied to the memory array, and ii) at least one reference applied to accesses of the data bits stored on the memory array, said at least one reference and the comparison distinguishing between logical levels represented by said at least one value, including:
changing the comparison by changing a ratio of a first resistance and a second resistance, the first resistance characterizing a first input circuit of a sense amplifier that receives said at least one value, the second resistance characterizing a second input circuit of the sense amplifier that receives said at least one reference.

13. The integrated circuit of claim 12, wherein said at least one value is a current representing said at least one of the plurality of data bits.

14. The integrated circuit of claim 12, wherein said at least one value is a voltage representing said at least one of the plurality of data bits.

15. The integrated circuit of claim 12, wherein the first check code and the second check code are error correcting codes.

16. The integrated circuit of claim 12, wherein the first check code and the second check code are error detecting codes.

17. The integrated circuit of claim 12, wherein the control circuitry performs said changing by changing the read bias arrangement applied to the memory array.

18. The integrated circuit of claim 12, wherein the control circuitry performs said changing by changing a word line voltage of the read bias arrangement applied to the memory array.

19. The integrated circuit of claim 12, wherein the control circuitry performs said changing by changing i) said at least one reference and ii) the read bias arrangement applied to the memory array.

20. The integrated circuit of claim 12, wherein the control circuitry further performs:
after said changing the comparison, based on changing the comparison, repeating one or more of:
said generating the first check code;
said accessing the second check code; and
said checking whether the first check code and the second check code are in agreement.

21. The integrated circuit of claim 12, wherein the control circuitry further performs:
after said changing the comparison, performing:
until success results from subsequent checking whether the first check code and the second check code are in agreement, iteratively changing the comparison.

22. The integrated circuit of claim 12, wherein said at least one reference distinguishes between at least a first logical level and a second logical level of said logical levels,
wherein said at least one value is accessed to distinguish whether said at least one of the plurality of data bits represents the first logical level or the second logical level, and
wherein the control circuitry performs said changing the comparison by:
widening a first range of the accessed values associated with the first logical level; and
narrowing a second range of the accessed values associated with the second logical level.

23. A memory integrated circuit, comprising:
a memory array means; and
control circuitry means coupled to the memory array means, the control circuitry means responsive to a read command, comprising:
   means for generating a first check code based on accessing a plurality of data bits stored on the memory integrated circuit;
   means for accessing a second check code stored on the memory integrated circuit as a plurality of check bits associated with the plurality of data bits;
   means for checking whether the first check code and the second check code are in agreement; and
   means, responsive to disagreement between the first check code and the second check code, for changing a comparison between i) at least one value representing at least one of the plurality of data bits stored on the memory integrated circuit, said at least one value accessed by a read bias arrangement applied on the memory integrated circuit, and ii) at least one reference applied to accesses of the data bits stored on the memory integrated circuit, said at least one reference and the comparison distinguishing between logical levels represented by said at least one value, including:
   means for changing a ratio of a first resistance and a second resistance, the first resistance characterizing a first input circuit of a sense amplifier that receives said at least one value, the second resistance characterizing a second input circuit of the sense amplifier that receives said at least one reference.

* * * * *